US009397500B2

(12) United States Patent
Orr et al.

(10) Patent No.: US 9,397,500 B2
(45) Date of Patent: Jul. 19, 2016

(54) INVERTER WITH EXTENDED ENDURANCE MEMORY

(71) Applicant: SOLANTRO SEMICONDUCTOR CORP., Ottawa (CA)

(72) Inventors: Raymond Kenneth Orr, Kanata (CA); Med Belhaj, Ottawa (CA)

(73) Assignee: SOLANTRO SEMICONDUCTOR CORP., Ottawa (CA)

( * ) Notice: Subject to any disclaimer, the term of this patent is extended or adjusted under 35 U.S.C. 154(b) by 496 days.

(21) Appl. No.: 13/930,708

(22) Filed: Jun. 28, 2013

(65) Prior Publication Data

US 2015/0006094 A1    Jan. 1, 2015

(51) Int. Cl.
| | |
|---|---|
| *G01R 31/40* | (2014.01) |
| *G01R 31/28* | (2006.01) |
| *H02J 3/38* | (2006.01) |
| *G01R 31/42* | (2006.01) |

(52) U.S. Cl.
CPC ............... *H02J 3/383* (2013.01); *G01R 31/42* (2013.01); *Y02E 10/563* (2013.01)

(58) Field of Classification Search
CPC .................................. H02J 3/383; G01R 31/42
USPC ............... 702/58; 713/340; 365/158, 185.07, 365/189.05, 201, 229, 226; 711/103, 136, 711/162
See application file for complete search history.

(56) References Cited

U.S. PATENT DOCUMENTS

| | | | | | |
|---|---|---|---|---|---|
| 4,271,487 | A | * | 6/1981 | Craycraft | G11C 14/00 327/198 |
| 4,692,903 | A | * | 9/1987 | Borg | G11C 5/143 365/226 |
| 5,001,332 | A | * | 3/1991 | Schrenk | G07F 7/0866 235/436 |
| 5,793,666 | A | * | 8/1998 | Yamazaki | G11C 17/126 365/104 |
| 5,953,261 | A | * | 9/1999 | Furutani | G11C 7/1051 326/83 |
| 6,317,359 | B1 | * | 11/2001 | Black | G11C 11/16 365/158 |
| 6,343,032 | B1 | * | 1/2002 | Black | G11C 14/0081 365/157 |
| 6,834,364 | B2 | * | 12/2004 | Krech, Jr. | G11C 29/56 714/45 |
| 6,871,305 | B2 | * | 3/2005 | Chien | G11C 16/349 365/185.09 |
| 7,302,592 | B2 | * | 11/2007 | Shipton | B41J 2/04505 713/300 |

(Continued)

FOREIGN PATENT DOCUMENTS

JP    11282761 A  * 10/1999

*Primary Examiner* — Carol S Tsai
(74) *Attorney, Agent, or Firm* — Pearne & Gordon LLP

(57) ABSTRACT

In accordance with the present disclosure there is methods of extending an expected lifetime of an inverter comprising a non-volatile (NV) memory and a high endurance memory by obtaining one or more measurements of the inverter and storing the one or more measurements to a high endurance memory of the inverter. Once stored, it is determined if a server-copy trigger condition is met and if it is at least a portion of the high endurance memory is stored to NV memory of the inverter.

18 Claims, 17 Drawing Sheets

(56) References Cited

U.S. PATENT DOCUMENTS

| | | | | |
|---|---|---|---|---|
| 7,747,887 B2* | 6/2010 | Shipton | ............... | B41J 2/04505 358/1.14 |
| 8,044,631 B2* | 10/2011 | Dai | ................. | H02M 7/53873 318/727 |
| 8,122,204 B2* | 2/2012 | Nagao | ............... | G06F 11/1666 365/189.04 |
| 8,811,049 B2* | 8/2014 | Fornage | ................ | H02J 3/005 307/82 |
| 8,904,098 B2* | 12/2014 | Amidi | ............... | G06F 11/1441 711/100 |
| 2002/0157042 A1* | 10/2002 | Krech, Jr. | .............. | G11C 29/56 714/45 |
| 2003/0225963 A1* | 12/2003 | Ajiro | ................... | G06F 15/7842 711/103 |
| 2010/0165674 A1* | 7/2010 | Dai | ................... | H02M 7/53873 363/37 |
| 2010/0293337 A1* | 11/2010 | Murphy | ............. | G06F 12/0866 711/136 |
| 2011/0138377 A1* | 6/2011 | Allen | .................... | G01D 4/004 717/173 |
| 2013/0019076 A1* | 1/2013 | Amidi | ................ | G06F 11/1441 711/162 |
| 2013/0227199 A1* | 8/2013 | Liu | ..................... | G06F 12/0246 711/103 |

\* cited by examiner

INVERTER WITH EXTENDED ENDURANCE MEMORY

This invention relates generally to the fields of power conversion and non-volatile memory management.

BACKGROUND

Renewable energy sources such as wind, solar photovoltaic (PV), or tidal are becoming an increasingly important source of electrical power generation. Many renewable energy sources produce Direct Current (DC) power which normally must be converted into Alternating Current (AC) power before it can be consumed. DC to AC conversion is performed by a device known as an inverter. Previously, an array of PV panels would connect to a single, large central inverter. Recently however, "microinverter" technology has been developed in which each PV panel is equipped with its own dedicated inverter and each PV panel and associated inverter outputs AC power. Microinverters offer potential advantages over central inverters including maximum power point tracking (MMPT) on a per PV panel basis, elimination of DC power busses, easy addition of incremental panels and more robust fault tolerance. Microinverters also offer the ability to monitor the performance of a PV array at the panel level affording detailed diagnostic data on a per panel basis.

Although microinverters have potential advantages, there are also potential problems associated with their use. In particular, since a single microinverter is associated with each PV panel in an installation, the cost of each individual microinverter should be kept as low as possible. Further, with the microinverters located at the PV panels, replacement or maintenance can be more difficult due to the location of PV panels, for example on a building's roof.

The lifetime cost of a microinverter can be lowered by reducing the initial cost of the inverter, for example by using less expensive components; by extending an expected lifetime of the inverter; by reducing maintenance required throughout the lifetime of the inverter; or by combinations thereof.

DETAILED DESCRIPTION

In accordance with the present disclosure there is provided a method of extending an expected lifetime of an inverter, the method comprising obtaining one or more measurements of the inverter; storing the one or more measurements to a high endurance memory of the inverter; determining if a NV-write trigger condition is met; and storing at least a portion of the one or more measurements stored to the high endurance memory to non-volatile memory of the inverter when the NV-write trigger condition is met.

In accordance with the present disclosure there is further provided a method of extending an expected lifetime of an inverter comprising a non-volatile (NV) memory and a high endurance memory, the method comprising obtaining one or more measurements of the inverter; storing the one or more measurements to a high endurance memory of the inverter; determining if a server-copy trigger condition is met; sending at least a portion of the high endurance memory to a server when the server-copy trigger condition is met; determining if an NV-write trigger condition is met; and retrieving at least a portion of the measurement stored at the remote server; and storing the portion of the measurements retrieved from the server to the NV memory when the NV-write trigger condition is met.

In accordance with the present disclosure there is further provided an inverter for a photovoltaic (PV) panel comprising power components for producing an alternating current (AC) output from a direct current (DC) input from the PV panel; a sensor for measuring an operating characteristic of the inverter; a non-volatile memory for storing measurement data; a high endurance memory for storing the data of the non-volatile memory while sufficient power is available; a controller for extending an expected lifetime of an inverter by: obtaining one or more measurements of the inverter; storing the one or more measurements to a high endurance memory of the inverter; determining if a NV-write trigger condition is met; and storing at least a portion of the one or more measurements stored to the high endurance memory to non-volatile memory of the inverter when the NV-write trigger condition is met.

An inverter is typically required for converting power from a direct current (DC) source, such as a photovoltaic (PV) panel, to an alternating current (AC), which may be provided to an electrical grid. In the case of PV panels, a single central inverter can be used to couple a plurality of PV panels to the electrical grid. Alternatively, each PV panel can have its own "microinverter" for generating AC power from the PV panel. An array of PV panels and associated microinverters can be coupled to the electrical grid at a single connection point.

Figure 1:
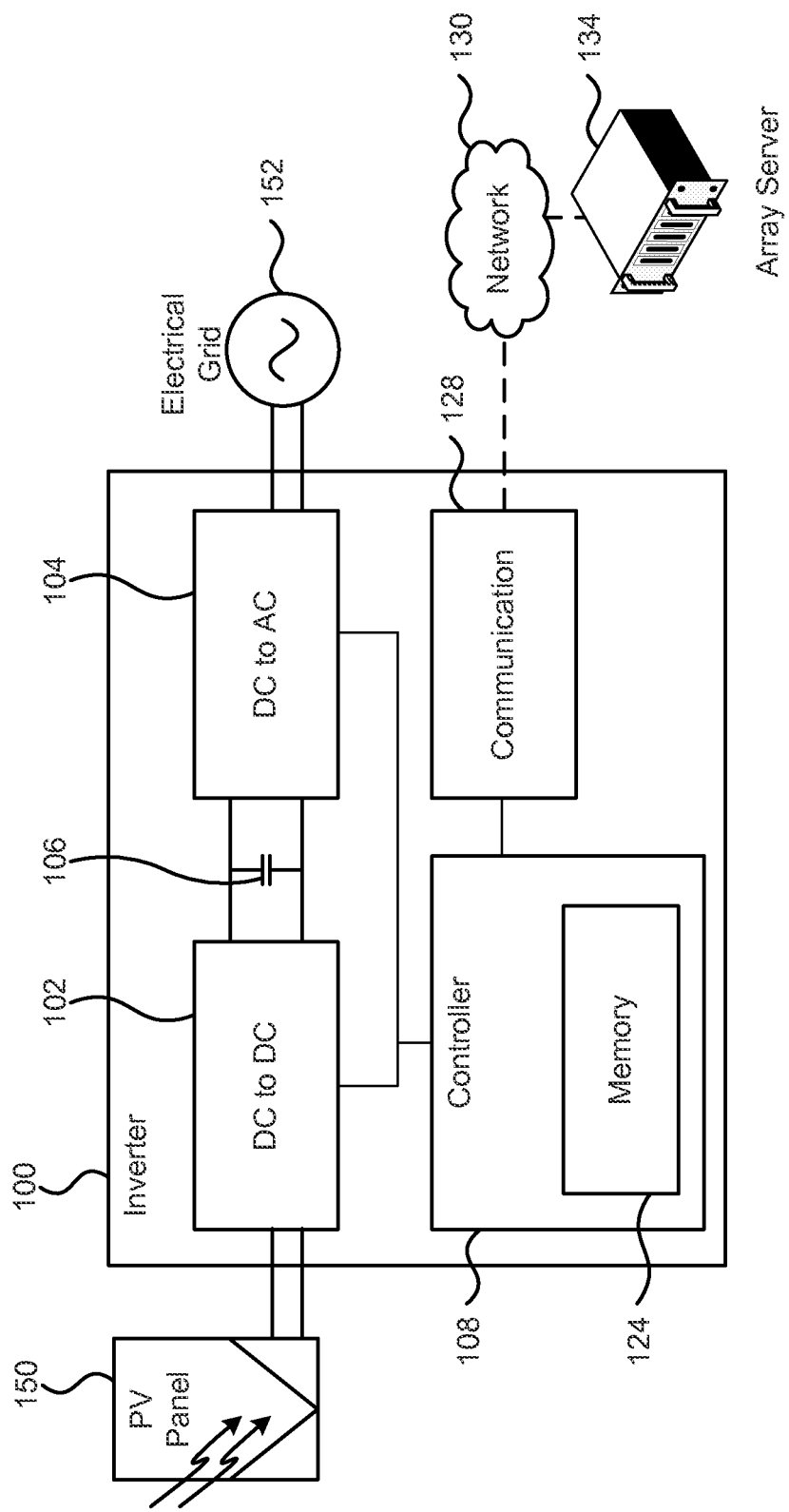
FIG. 1 is a block diagram of an illustrative microinverter.

FIG. 1 is a block diagram of an illustrative microinverter, also referred to simply as an inverter for brevity. Inverter 100 receives DC power from PV panel 150 and outputs AC power to an electrical grid 152. The electrical grid 152 may be an internal household grid for a small residence or business, a microgrid for an institution such as a hospital, university campus or factory complex or an electrical utility grid. Although not shown in FIG. 1, there may also be various disconnect means and power conditioning apparatus such as breakers, switches, fuses or transformers between the output of the inverter and the electrical grid 152.

Inverter 100 comprises DC to DC converter 102, DC to AC converter 104, DC link capacitor 106, controller 108 and communication interface 128. DC power produced by the PV panel 150 is input into the DC to DC converter 102. The output of the DC to DC converter 102 is connected to the input of the DC to AC converter 104 with the DC link capacitor 106 connected across the connection. Controller 108 controls the operation of the DC to DC converter 102 and the DC to AC converter 104. Although depicted as a single controller 108, it is contemplated that the control could be provided by multiple discrete controllers. For example, controller 108 may consist of two separate microcontrollers, one of which controls the DC to DC converter 102 and the other controls DC to AC converter 104. Further, although depicted as being separate from the converters 102, 104, the controller 108 may be incorporated into the converters 102, 104. Regardless of the specific physical implementation of the controller 108, it can perform a number of control functions including Maximum Power Point Tracking, switch timing control and anti-islanding detection. Controller 108 may comprise memory 124 for the storage of data and instructions. The memory 124 may include both read only memory (ROM) and random access memory (RAM) for the storage of instructions, operating parameters and data on the operation of the inverter.

The controller 108 may communicate with an array server 134 using the communication interface 128. The communication interface may use any number of communication protocols including both wired and wireless communication protocols, such as ZIGBEE, Bluetooth, WiFi or narrow band Power Line Communication. The inverter 100 may communicate directly with the array server 134 or through one or more networks 130 as depicted. The array server may provide array commands to the controller 108 in order to control the operation of the inverter. Additionally or alternatively, the inverter may communicate operational information to the array server for storing and or display. For example, the operating information could be displayed to the power PV panel owner to show power production over various times. The array server may be located locally, adjacent to a panel array or may be remotely located.

The memory 124 may store historical data that includes measurements of the operating characteristics of the PV panel as well as operating characteristics of the inverter and AC grid. These characteristics may include for example: data such as power production, panel voltage, operating temperatures recorded on a minute by minute, hourly or daily basis. The amount of measurements that are stored may go back for a week, a month or to the commissioning of the panel. The data may also indicate the date and duration of any recent electrical grid power outages.

The data stored in memory 124 may also comprise other cumulative types of measurements such as the total power production of the panel over its lifetime, total hours the inverter has been in the field, total hours the panel generated power, as well as power or temperature histograms.

The data stored in memory 124 may be used in controlling the operation of the inverter. For example, if the inverter has a number of redundant components, such as a number of DC link capacitors 106, selecting which one of the redundant components to use may be based on previous operating characteristics such as which of the redundant components were previously used.

Although the size of a single measurement set recorded at a single time may vary depending upon the measurement data included in the set, the size of a single illustrative measurement set, recorded at a single time is in the range of 32 B to 64 B. For example, a measurement set may include the inverter temperature, sub-string voltages of the panel's substrings, panel current, the DC link voltage, the AC electrical grid voltage and frequency. Measurements may range in size for example from 1 B to 4 B.

Further to potentially being used in the control of the inverter, the data stored in memory 124 may be useful in diagnosing problems with the PV panel and/or the inverter. In the event of a failure of the panel or the inverter these measurements may be useful in diagnosing the cause of the failure. Although the data may be available at the array server, it may not provide the most recent data, or it may be difficult, or at least inconvenient, for a manufacturer or repair facility tasked with repairing the faulty PV panel or inverter to access the data on the array server or it may be that the array server only contains summary data for the inverter. If the data stored in memory 124 is able to survive after loss of the inverter's operating power, the data would be available to manufacturers or repair facilities for use in diagnosing the failure.

In some cases the inverter derives its operating power exclusively from the PV panel. In this case loss of power may be a nightly occurrence. In other cases the inverter may derive its operating power from both the panel and the grid. In this case power loss might occur, for example, from a grid power outage during the night. An inverter might also lose its operating power from a catastrophic event such as a cabling failure or fire within the PV panel array.

Memory which retains its contents in the event of a loss of power is called non-volatile (NV) memory. A popular type of NV memory is called flash memory. Other types of NVM include EEPROM, Ferroelectric memory (FeRAM) and phase change memory (PCRAM). Although NV memory retains its contents in the absence of power, it may suffer from limited write endurance. In particular, flash and EEPROM memories are limited in the number of times the memory can be rewritten before the memory's ability to store data becomes unreliable. While current large capacity flash memories have write endurances that make them suitable for use in numerous applications, the write endurance of flash memories may not be sufficient to function reliably over the expected lifetime of an inverter, which may be for example 30 years. Further, the write endurance of flash memory typically decreases as the size of the memory decreases since sophisticated endurance extension methods such as error correcting codes are not possible on smaller memories Although the use of NV memory for storage of data provides various advantages as noted above, it may have a potentially detrimental effect on the expected lifetime of the inverter. For example, in some inverter designs, one component of the controller 108 might be a single chip microcontroller with on board "embedded" flash memory. The endurance of embedded flash memory is typically much lower than the endurance of a dedicated memory integrated circuit (IC) such as that used in high capacity solid state drives and may be on the order of only 10,000 writes. The amount of flash memory embedded on a microcontroller, which may be typically on the order of 64 Kbytes to 256 Kbytes, although larger sizes such as up to several megabytes are possible, is significantly less than the amount of memory available in a dedicated flash memory integrated circuit, flash memory card or solid state drives, which may have storage capacities ranging from a few Gigabytes to several hundred Gigabytes. The write endurance of the flash memory may not be sufficient to provide reliable storage for measurements over the entire lifetime of the inverter.

The write endurance of an inverter's memory should be high enough to accommodate the number of writes anticipated over the inverter's lifetime. Some types of measurements might require a very high endurance. For example, if one piece of measurement data is the total power production of the panel since it has been operational and is updated once a minute, then for an inverter having an expected lifetime of 30 years the required write endurance of the memory is:

$$30 \text{ years} \times 365 \text{ days} \times 24 \text{ hours} \times 60 \text{ minutes} = 1.577 \times 10^7.$$

The required write endurance for such measurements may be much greater than the write-endurance of flash memory or other NV memory, and in particular is much greater than the write endurance typical of embedded NV memory. The write endurance of flash memory may also be affected by the operating temperature of the memory when write operations occur. As described further below, the write endurance of NV memory can be extended by only writing to the NV memory when a write trigger condition is satisfied. As described below, the write trigger condition may be used to reduce the number of writes made to the NV memory, reduce the temperature at which the writes occur, or a combination thereof.

Figure 2:
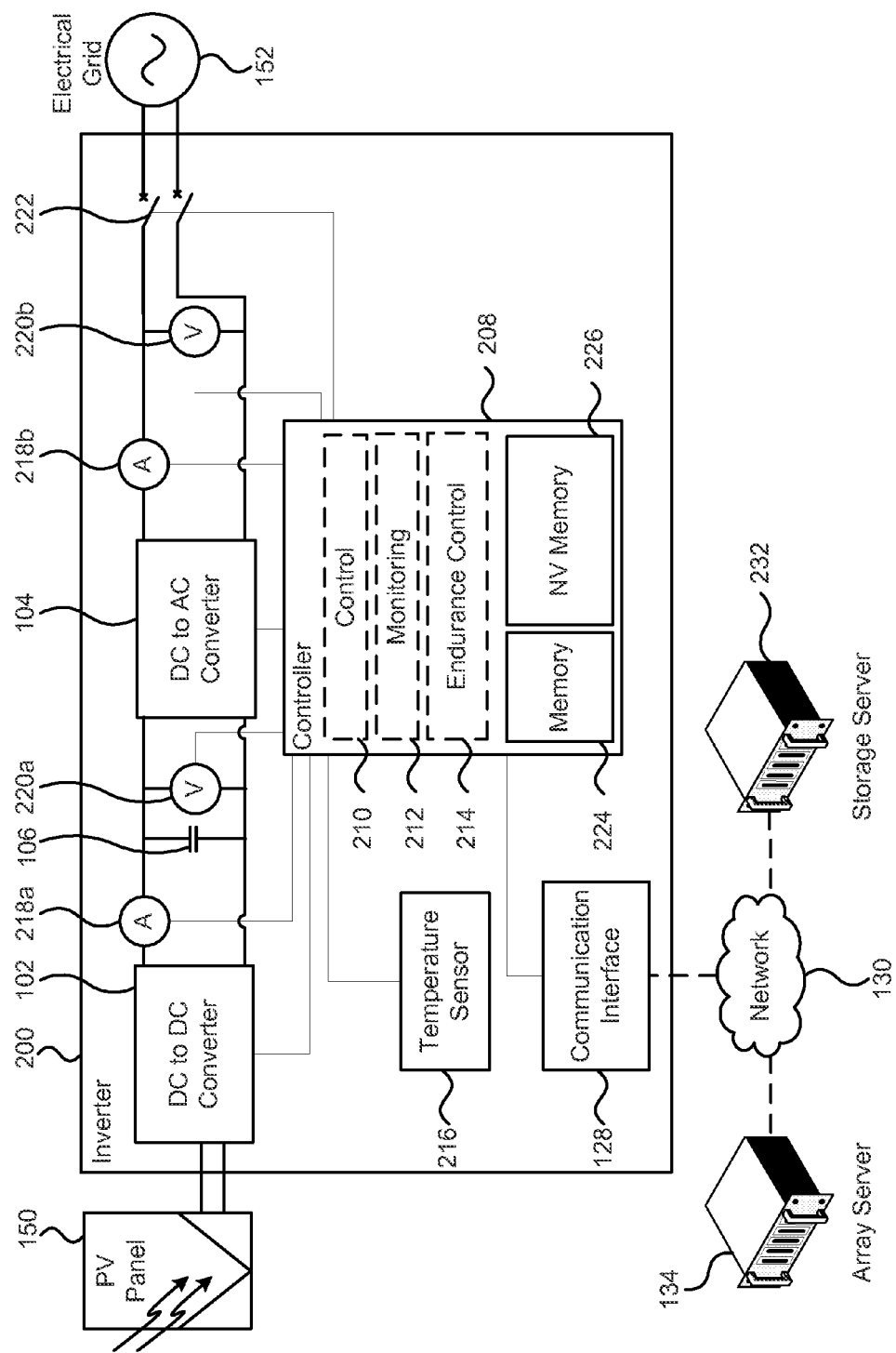
FIG. 2 is block diagram of an inverter with improved NV memory endurance.

FIG. 2 is block diagram of an inverter with improved NV memory endurance. As depicted in FIG. 2, the inverter 200 comprises, in addition to the DC to DC converter 102, the DC to AC converter 104 and the DC link capacitor 106, a controller 208 that includes high endurance memory 224 as well as NV memory 226. The controller 208 may be a microcontroller with the high endurance memory 224 and the NV memory embedded within it. The high endurance memory may have a size of, for example 2 KB-32 KB, while the NV memory 226 may have a size of, for example 32 KB-256 KB. The high endurance memory 224 has significantly greater write endurance than the NV memory. The high endurance memory 224 allows for the temporary storage of measurement data until a write trigger condition is met. The high endurance memory 224 may be provided as separate memory in addition to operation memory of the controller such as described above with regard to memory 124. Alternatively, the high endurance memory may be provided by a portion of the operational memory. The high endurance memory 224 may be Static Random Access Memory (SRAM) or Dynamic Random Access Memory (DRAM). SRAM and DRAM are examples of volatile memory and they do not retain their contents when power is lost. An advantage of both SRAM and DRAM however, is that they have unlimited write endurance. Inverter 200 also comprises a number of sensors. The sensors may comprise one or more temperature sensors 216, which measure a temperature of a component. The sensors may further comprise sensors for measuring an output current 218a of the DC to DC converter 102, a voltage 220a of the DC link capacitor 106, a current 218b supplied to the electrical grid 152 as well as the voltage 220b of the electrical grid 152. The sensors may further comprise sensors (not shown) for measuring a voltage and current of the PV panel 150. Each of the sensors provides their measurements to the controller 208, which can take continuous or periodic readings of the sensors. The controller 208 may include an internal clock (not depicted) that provides a real time clock that allows the controller to record a time measurements were taken. Alternatively the clock may be a grid derived clock and may provide relative rather than absolute time measurement. The inverter 200 may further comprise a controllable switch 222 for connecting or disconnecting the inverter from the electrical grid 152.

The inverter 200 further comprises a communication interface 128 as described above with regard to inverter 100. The communication interface 128 allows inverter 200 to communicate with servers or computers. The communication can be made directly or through a network 130 as depicted. The servers may include a array server 134 as well as a storage server 232 for storing measurement data provided from the inverter 200. The array server 134 and the storage server 232 may be provided by the same physical server or by separate physical servers. The servers 134, 232 may be located in the vicinity of a PV panel array or may be provided at remote locations. The servers 134, 232 may communicate with all inverters of the PV panels in the array. The communication interface may use any suitable communication technology. The communication technology is preferably low powered. The communication interface 128 may be a wireless protocol such as, for example, Zigbee, Bluetooth, or WiFi or it may be a wired protocol such as powerline communication or Ethernet.

The controller 208 may execute instructions stored in operational memory, which may also provide the high endurance memory 224. The operational memory may be provided by a combination of Read Only Memory (ROM) as well as RAM. The instructions configure the controller 208 to provide various functionality including control functionality 210, monitoring functionality 212 and write endurance control functionality 214. The control functionality 210 controls the overall operation of the inverter and can provide MPPT functionality for keeping the PV panel at its maximum power production under changing insulation. The control functionality 210 may further provide safety functions, such as fault ride through, island detection, and grid disconnection. The control functionality 210 may utilize measurements provided by monitoring functionality 212. The monitoring functionality can take measurements from the sensors. The monitoring functionality 212 can take the measurements either continuously or discretely. The write endurance control functionality 214 controls the writing of measurement data to the NV memory 226 in order to extend an expected lifetime of the NV memory 226, and so the inverter.

The write endurance control functionality 214 controls when data is written to the NV memory 226. The write endurance control functionality stores data in the high endurance memory 224 until a write trigger condition is met, at which point the write endurance control functionality copies data from the high endurance memory 224 to the NV memory 226. The write trigger condition may be the number of writes to the high endurance memory 224 that have occurred without a write to NV memory 226. For example, measurements may be written to the high endurance memory once every minute, while the write endurance control functionality only writes to the NV memory every 7 days. That is, the write trigger condition would be that there have been 10080 (60 minutes×24 hours×7 days) writes to the high endurance memory 224 without a write to the NV memory 226. The write trigger condition may further be an operating temperature of the inverter or NV memory 226 so that the NV memory 226 is only written to when the temperature is below a threshold temperature. Illustrative methods of extending an expected lifetime of an NV memory of an inverter are described further below with regard to FIGS. 4-12.

Figure 3:
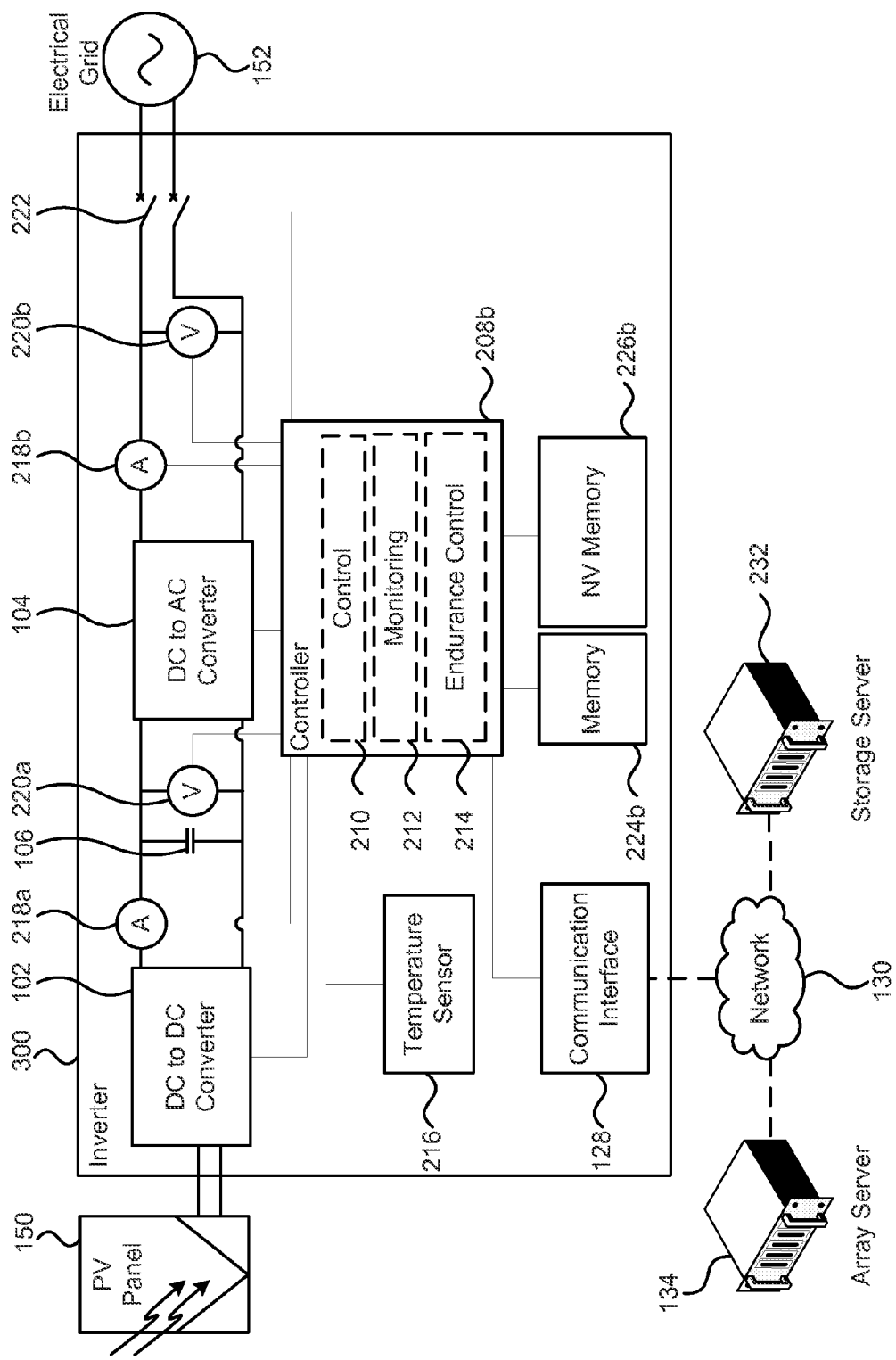
FIG. 3 is block diagram of a further inverter with improved NV memory endurance.

FIG. 3 is block diagram of a further inverter with improved NV memory endurance. The inverter 300 is similar to the inverter 200; however the controller 208 of inverter 200 has embedded high endurance memory 224 and NV memory 226, while the controller 208b of inverter 300 is connected to external high endurance memory 224b and NV memory 226. The inverter 300 operates in substantially the same way as the inverter 200 described above with reference to FIG. 2 and as such is not described further.

Figure 4:
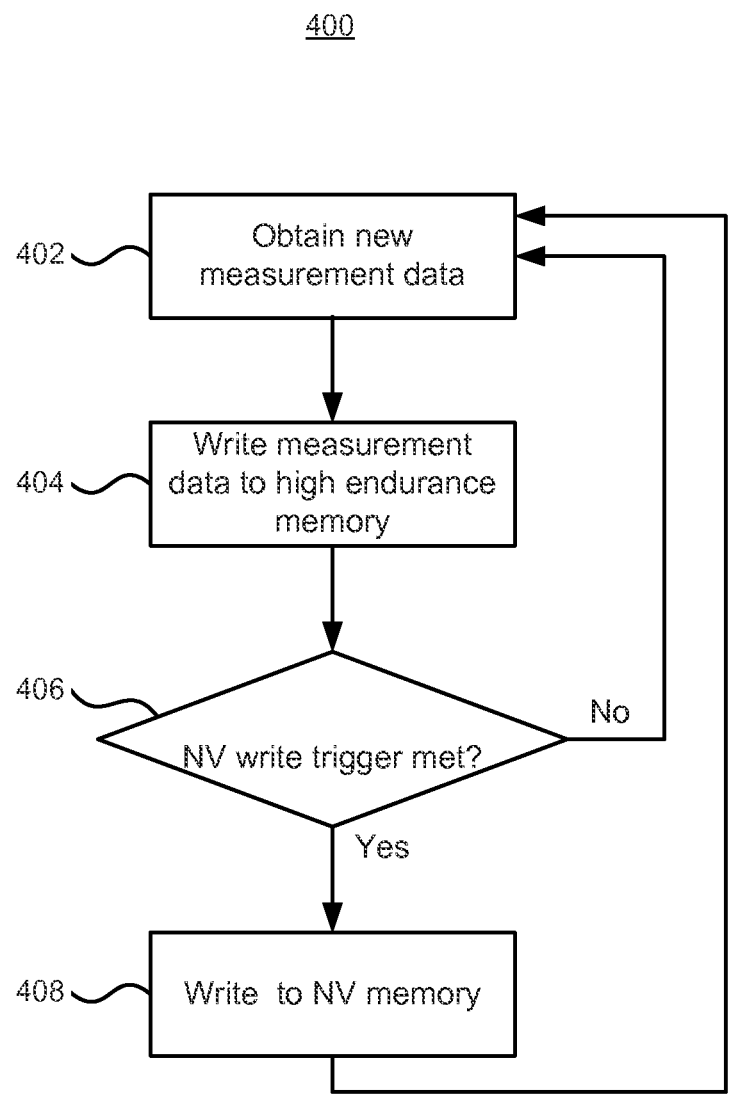
FIG. 4 is a flowchart showing a method of extending the endurance of an inverter's NV memory.

FIG. 4 is a flowchart showing a method of extending the endurance of an inverter's NV memory. The method 400 obtains new measurement data (402) of operating characteristics of the inverter. The measurement data may comprise a set of measurements made over a measurement interval. The measurement interval may be any interval such as 1 minute, 3 minutes, 5 minutes, 15 minutes, 20 minutes, 30 minutes, an hour, 3 hours, 5 hours, 12 hours, 24 hours, 3 days, 5 days or 7 days. An illustrative measurement interval is 15 minutes. Accordingly, new measurements are made every 15 minutes. It should be appreciated that although the measurements are described as being made every 15 minutes, the measurements may require continuous measuring of a parameter over the measurement interval. For example, the measurement may be a cumulative amount of power in Watt-hrs injected into the electrical grid over the measurement interval. Further measurements made over the measurement interval may include:
- a cumulative amount of power injected from the PV panel;
- an average voltage of the PV panel;
- an average voltage of the DC link;
- an average voltage of the electrical grid;
- a peak voltage of the PV panel;
- a peak voltage of the DC link;
- a peak voltage of the electrical grid;
- an average temperature of one or more components of the inverter;
- a peak temperature of one or more components of the inverter; and
- a minimum temperature of one or more components of the inverter.

In addition to the above direct measurements, the controller may also calculate one or more measurements based on the direct measurements such as the total power production of the panel or the operating life of the panel. The controller may update one or more histogram values based on the measurements. For example, a histogram may be provided for the frequency that the inverter has operated between various temperatures or the frequency that the PV panel's output power has been between various powers over its operating life. These direct measurements and calculated measurements will be both be referred to as measurements.

Once the measurements are made, they are written to the high endurance memory (404), and it is determined if a write trigger condition has been met (406). If the write trigger condition is not met (No at 406) nothing is written to the NV memory and new measurement data can be obtained (402). If the write trigger is met (Yes at 406) the measurement data from the high endurance memory is written to the NV memory (408). The write trigger may be used to reduce the number of writes made to the NV memory and/or control when the data is written so as to be written to the NV memory under more favorable conditions for extending the write endurance of the NV memory. Accordingly, it is possible to provide an inverter that can reliably store measurement data over the entire expected lifetime of the inverter.

Figure 5:
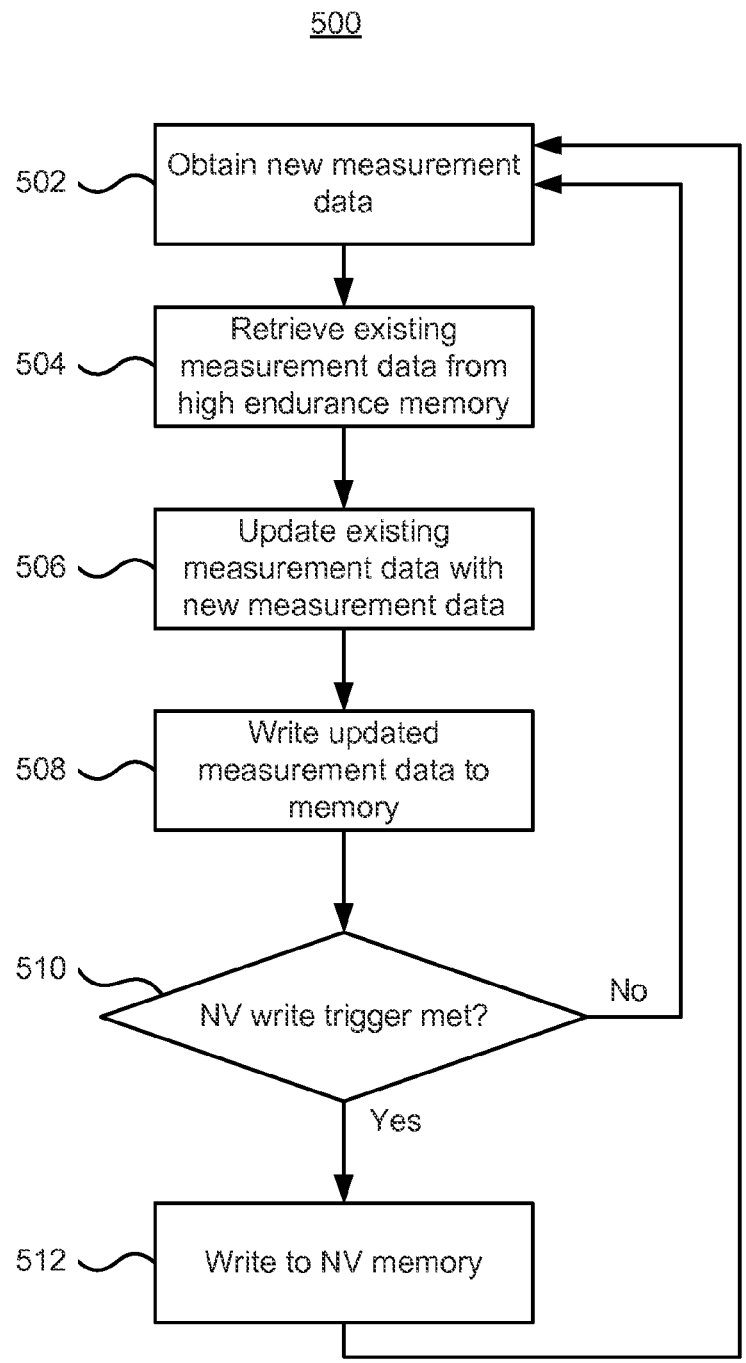
FIG. 5 is a flowchart showing a further method of extending the endurance of an inverter's NV memory.

FIG. 5 is a flowchart showing a further method of extending the endurance of an inverter's NV memory. The method 500 is similar to the method 400. The method 500 obtains new measurement data (502). The measurement data may comprise a set of measurements made over a measurement interval and be used to update other existing measurements. For example, the amount of power produced over the measurement interval may be used to update a total amount of power produced over the lifetime of the inverter. Existing measurement data are retrieved from the high endurance memory (504) and updated with the new measurements (506). The updated data is written to the high endurance memory (508) and it is determined if a write trigger condition is met (510). If the write trigger condition is not met (No at 510), new measurement data can be obtained (502). If the write trigger condition is met (Yes at 510), the measurement data from the write endurance memory is written to the NV memory (512).

As described above, a write trigger condition is used to extend the expected lifetime of the NV memory. As described further below, various write trigger conditions are possible, including setting a number of measurements that have been taken since a write to the NV memory, setting a number of measurements that can be stored in the write endurance memory without being written to the NV memory, or setting a temperature, or temperature range, at which the data should be written to the NV memory.

Figure 6:
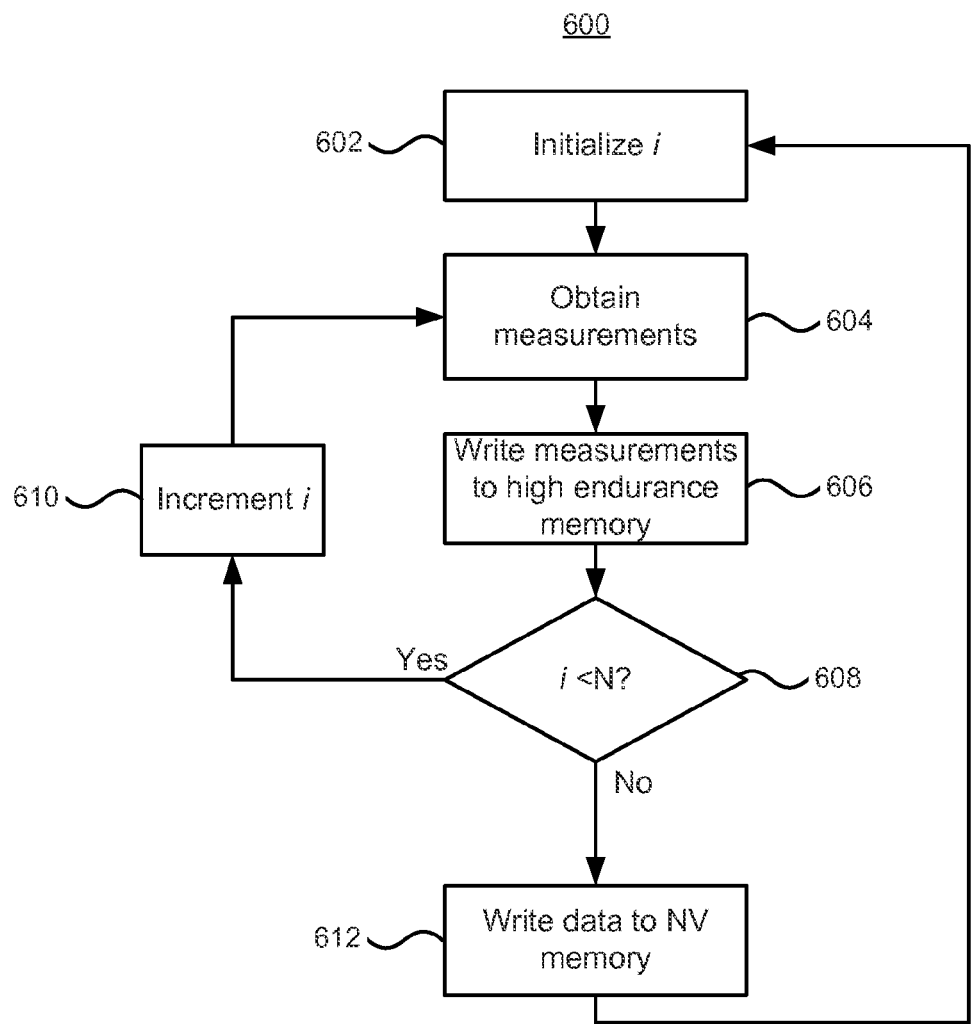
FIG. 6 is a flowchart showing a further method of extending the endurance of an inverter's NV memory.

FIG. 6 is a flowchart showing a further method of extending the endurance of an inverter's NV memory. In method 600, a counter "i" is initialized, for example to 1 (602). A set of measurements are obtained (604) and written to the high endurance memory (606). The measurements may be direct measurements or calculated measurements as described above. The counter i is compared to a write threshold "N" (608). If i is less than N (Yes at 608) then i is incremented (610) and another set of measurements obtained (604). If i is not less than N (No at 608) then the N measurements that were previously written to the high endurance memory are written to the NV memory (612) and the counter i initialized again (602).

In method 600 measurements are stored to the high endurance memory and only written to NV memory after every N measurement cycles. This method reduces the number of times the NV memory is written by a factor of N, extending the endurance of the inverter's NV memory.

In some embodiments the write threshold N is determined by the size of the measurement set and the size of the high endurance memory. In these embodiments overwriting of the high endurance memory without first writing to NVM is not permitted. For example, if the high endurance memory is 16 KB and a measurement set is 64 B then N can be no greater than 256, otherwise measurements that have not been stored to the NV memory would be written over in the high endurance memory by the newest measurement data. If a measurement set is 64 B and measurements are taken every 15 minutes for 9 hours per day then a 16 KB memory can store about a week's worth of measurement sets. As described further, the high endurance memory may store cumulative measurements in addition to the individual measurement sets.

In some embodiments, if the measurement is a cumulative value such as, for example, total power production then only the last ($N^{th}$) measurement is written into the NV memory. If the data is a measurement sequence such as, for example, hourly power production or operating temperature collected over the last week then the NV memory may be updated with all new measurements acquired since the last write to the NV memory.

Figure 7:
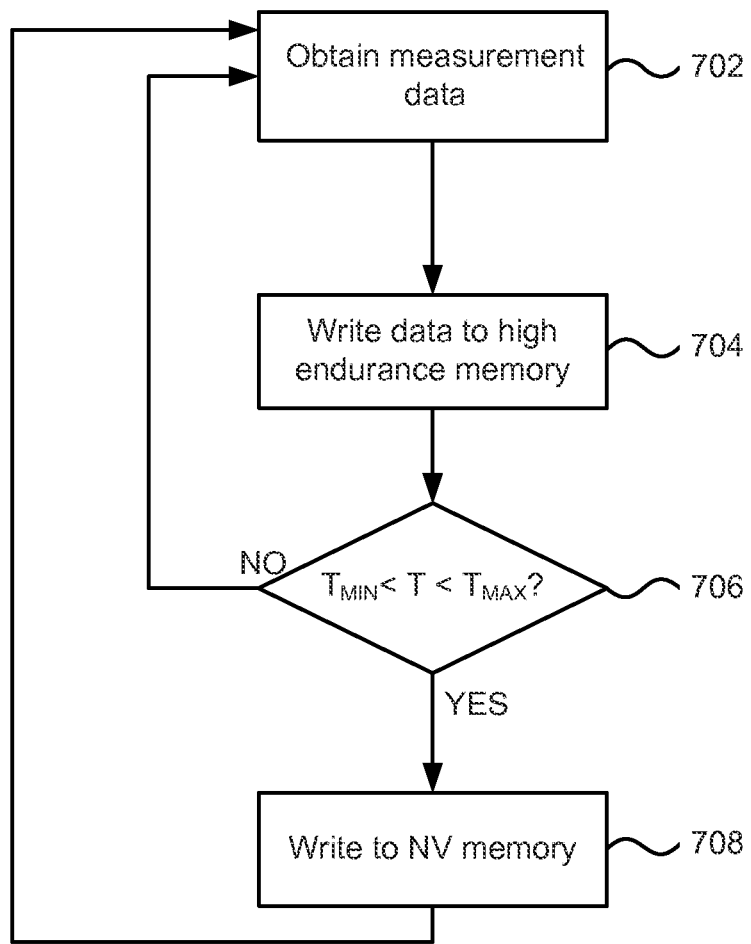
FIG. 7 is a flowchart showing a further method of extending the endurance of an inverter's NV memory.

FIG. 7 is a flowchart showing a further method of extending the endurance of an inverter's NV memory. The method 700 only writes to the NV memory if the temperature is within a range. Inverters are typically affixed to the back of a PV panel or integrated into the PV panel itself. PV panels are typically deployed out of doors and can therefore be subject to extreme temperatures as well as large daily temperature fluctuations. In some locations for example, the interior temperature of an inverter can exceed 100° C. The endurance of NV memories may be decreased by operating at extreme temperatures. For example, the endurance of a flash memory at 85° C. may be a half of its endurance at 25° C.

In the method 700, a set of measurements are obtained (702) and written to the high endurance memory (704). The current temperature, T, is compared to determine if it is above a minimum temperature $T_{min}$ and below a maximum temperature $T_{max}$ (706). If T is not within the range of $T_{min}$ to $T_{max}$ (No at 706) no data is written to the NV memory and another measurement set may be obtained (702). If T is within the range of $T_{min}$ to $T_{max}$ (Yes at 706) then the measurements stored in the high endurance memory since the last write to NV memory are written to the NV memory (708) and the counter i initialized again (602).

The method 700 restricts writing to the NV memory to when the temperature is within a preferred operating range. During daylight hours of an especially hot summer day, for example, the inverter temperature may be above $T_{MAX}$. During the night time however, the inverter may cool sufficiently such that its temperature drops below $T_{MAX}$ and a write operation may take place. The temperature limits may be set on the temperature distribution of the location in which the inverter is deployed. Further, although described as having a minimum and maximum temperature, it is contemplated that only an upper limit on the temperature is used as the write trigger condition.

Figure 8:
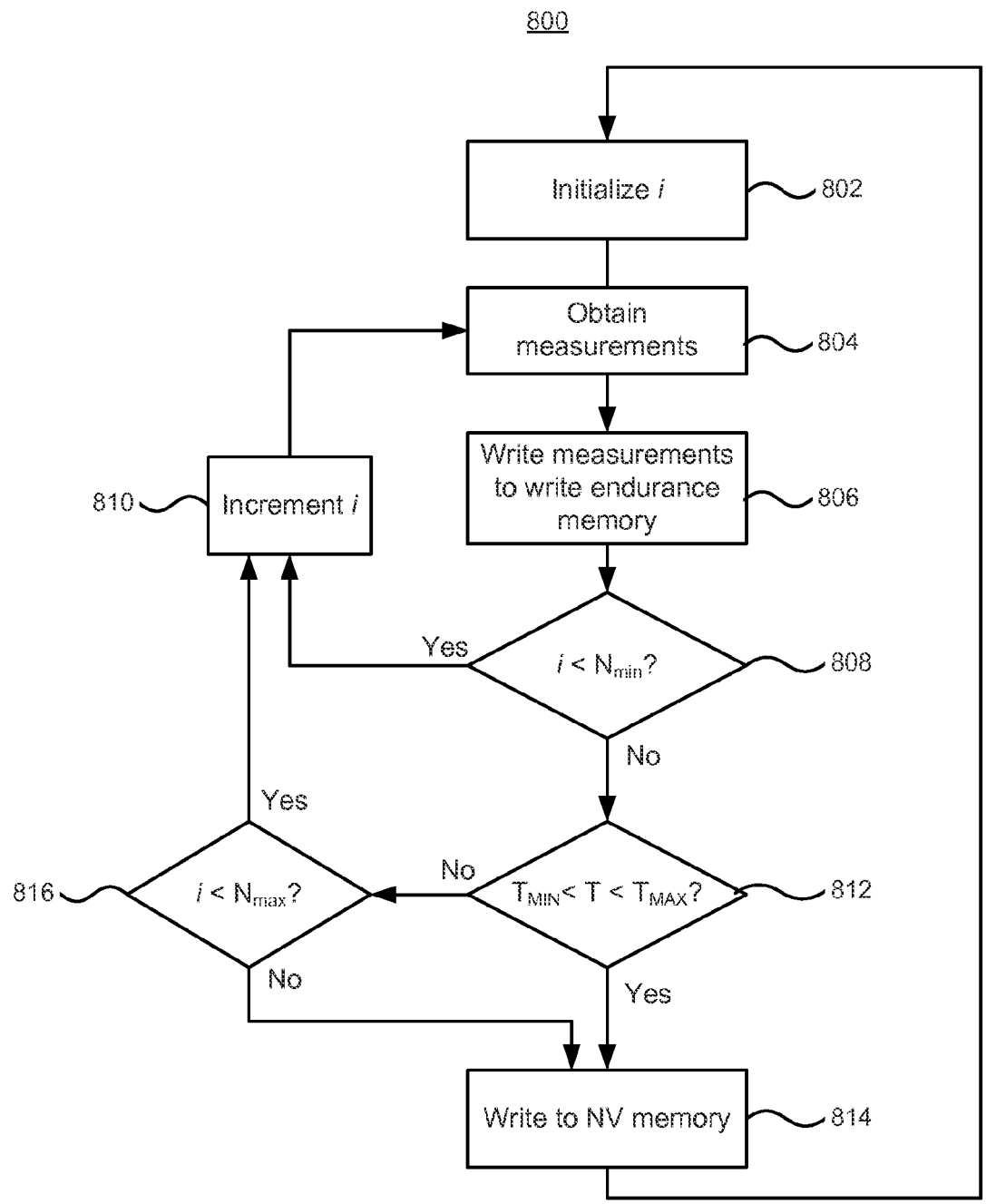
FIG. 8 is a flowchart showing a further method of extending the endurance of an inverter's NV memory.

FIG. 8 is a flowchart showing a further method of extending the endurance of an inverter's NV memory. The method 800 uses both a number of measurement sets that have been taken as well as a current inverter temperature as the write trigger condition. In method 800, a counter i is initialized, for example to one (802). A set of inverter measurements are obtained (804) and stored in the high endurance memory (806). The counter i is compared to a write threshold "$N_{MIN}$" (808). $N_{MIN}$ represents the minimum number of measurements taken before attempting a write to the NV memory. If i is less than $N_{MIN}$ (Yes at 808) then the counter i is incremented (810) and another set of measurements are obtained (804). If i is not less than $N_{MIN}$ (No at 808) then the temperature of the inverter T is compared to upper and lower temperature limits $T_{MIN}$ and $T_{MAX}$ (812). If the inverter's temperature is between the upper and lower temperature limits (Yes at 812) then the previous measurements stored in the high endurance memory are stored to the NV memory (814) and the counter i is subsequently re-initialized (802). If the temperature T is not within the upper and lower temperature limits (No at 812) then the counter i is compared to a second write threshold "$N_{MAX}$" (816), $N_{MAX}$ represents the maximum number of measurements that are allowed to be taken with a write to the NV memory. If i is less than $N_{MAX}$ (Yes at 816) then i is incremented (810) and further measurements may be obtained. If i is not less than $N_{MAX}$ (No at 816) then the previous measurement data stored to the high endurance memory is stored to the NV memory (814) regardless of the inverter temperature.

In the above method 800, measurement data is temporarily stored in the high endurance memory and written from high endurance memory to the NV memory when the first write threshold is met and the inverter temperature is within prescribed limits or the number of measurements taken since the last write to NV memory meets or exceeds the second write threshold. The upper and lower temperature limits may be chosen to provide the desired write endurance of the NV memory. In one embodiment $T_{MAX}$ is 35° C. and $T_{MIN}$ is 15° C. Further, although described as having a minimum and maximum temperature, it is contemplated that only an upper limit on the temperature is used.

$N_{MIN}$ and $M_{MAX}$ may be selected based on various criteria, including the size of an individual measurement set, the size of the high endurance memory, a desired endurance of the NV memory as well as other factors. In another embodiment $N_{MIN}$ may be set to one. In this embodiment measurements only accumulate in the write endurance memory when the inverter temperature is outside the preferred temperature range defined by the lower and upper temperature limits.

Figure 9:
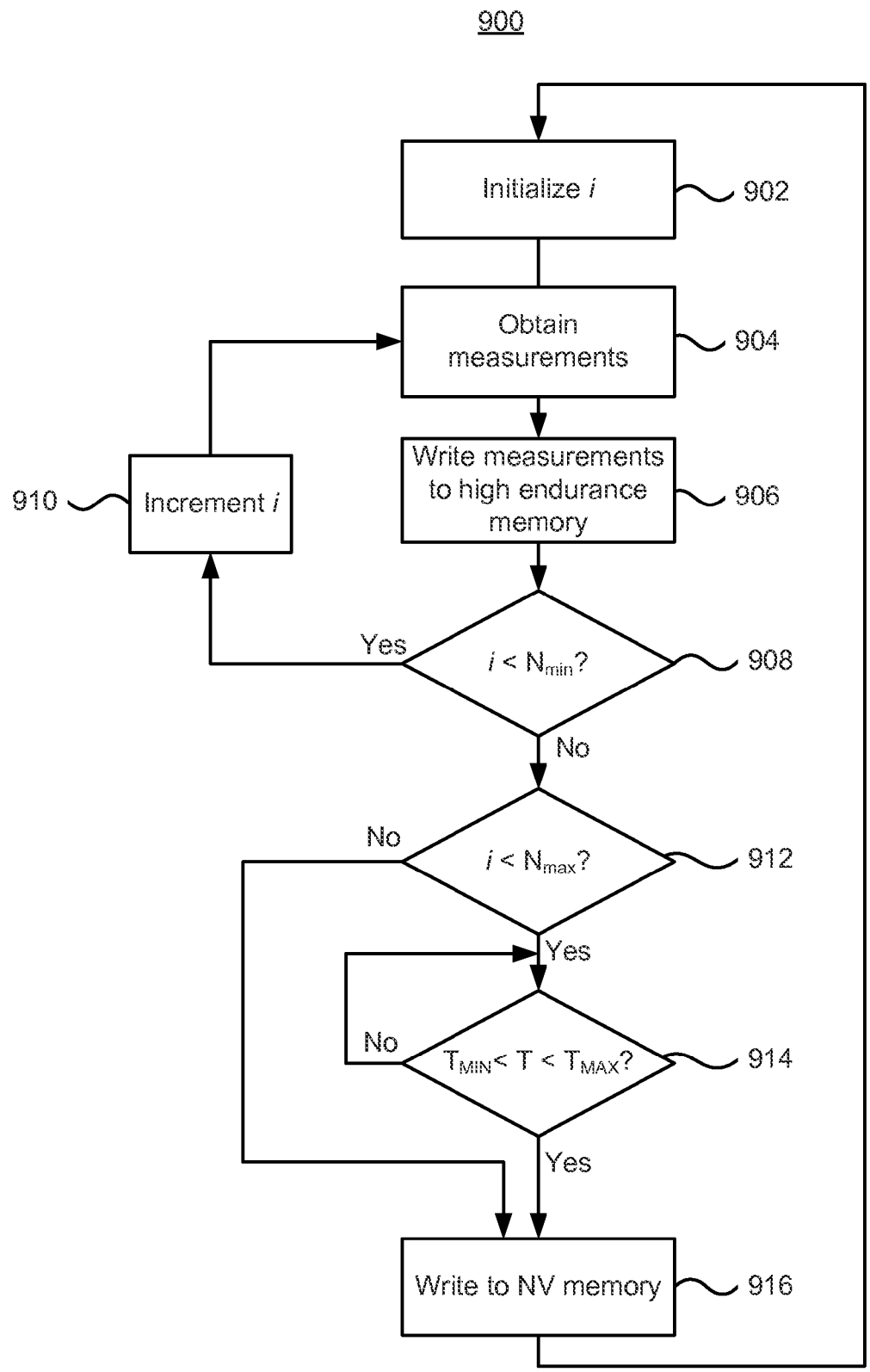
FIG. 9 is a flowchart showing a further method of extending the endurance of an inverter's NV memory.

FIG. 9 is a flowchart showing a further method of extending the endurance of an inverter's NV memory. The method 900 is similar to the method 800 and uses both a number of measurement cycles as well as a current temperature of the inverter as the write trigger condition. However, once the minimum number of measurement sets, $N_{min}$ have been stored to the high endurance memory, the temperature is continually monitored so that as soon as it is within the defined temperature range, the measurements are stored to the NV memory.

In method 900, a counter i is initialized, for example to one (902), a set of inverter measurements is obtained (904) and stored in the high endurance memory (906). The counter i is compared to a write threshold "$N_{MIN}$" (908). If i is less than $N_{MIN}$ (Yes at 908) then the counter i is incremented (910) and another set of measurements are obtained (904). If i is not less than $N_{MIN}$ (No at 908) then i is compared to $N_{MAX}$ (912) and if it is greater than or equal to $N_{MAX}$ (No at 912) then all of the measurements stored in the high endurance memory since the last write to NV memory are stored to the NV memory (914). If i is less than $N_{MAX}$ (Yes at 912) the temperature of the inverter T is compared to upper and lower temperature limits $T_{MIN}$ and $T_{MAX}$ (914). If the inverter's temperature is between the upper and lower temperature limits (Yes at 914) then the measurements stored in the high endurance memory since the last write to NV memory are stored to the NV memory (914) and the counter i is subsequently re-initialized (902).

If the temperature T is not within the upper and lower temperature limits (No at 914) the temperature continues to be monitored so that the measurement data will be written to the NV memory once the temperature is within the defined range. While the temperature is continuously being monitored, additional measurements may be made, and if a sufficient number, i.e. $N_{MAX}$, are made they can be stored to the NV memory. Accordingly, the measurement data is written to the NV memory once the temperature is within the defined range, rather than being delayed by a measurement cycle as would be the case according to method 800.

Some forms of high endurance memory such as SRAM and DRAM are volatile and do not retain their memory contents when power is removed. In this case, if the inverter loses power, any measurements that have not been stored to the NV memory will be lost. It is possible to reduce the number of measurements that are stored in volatile high endurance memory without storing to the NV memory so that if a power failure does occur only an acceptable amount of data will be lost. Although such an approach benefits by mitigating problems associated with lost measurements, it may result in more frequent writes to the NV memory, and so reduce the expected lifetime of the NV memory. As described further herein, it is possible for the inverter to detect a loss of power condition and copy the measurements from the volatile high endurance memory to the NV memory before all power is lost. The inverter includes at least one DC link capacitor that can provide sufficient power to complete the write to the NV memory. Accordingly, if the loss of power is detected in a timely manner, the power stored in the DC link capacitor can be used to complete the write. It is contemplated that other backup power supplies may be used such as a battery; however, such solutions add to the complexity and cost of the inverter and also provide another component that may fail.

Figure 10:
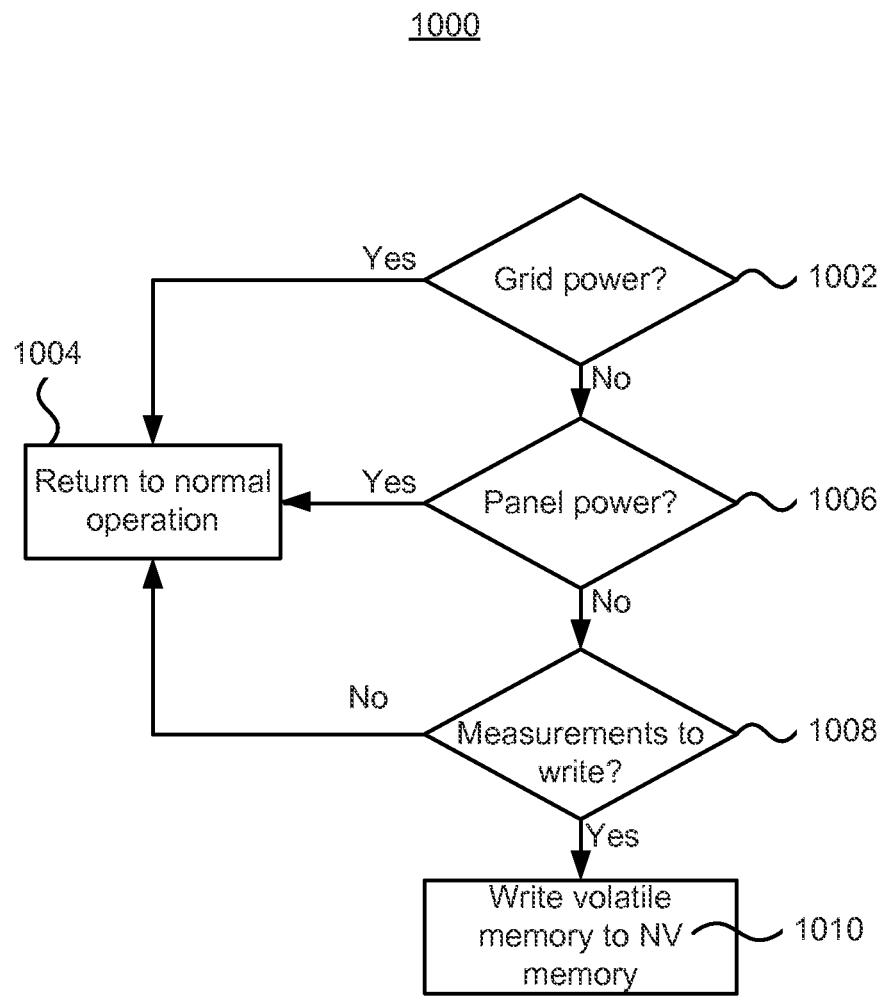
FIG. 10 is a flowchart of a method to prevent an inverter's measurement data being lost from a loss of operating power.

FIG. 10 is a flowchart of a method to prevent an inverter's measurement data being lost from a loss of operating power. The method 1000 continually checks to determine that grid power is present (1002). If grid power is present (Yes at 1002) normal operation continues (1004). If grid power is not present (No at 1002) a check for the presence of PV panel power is made (1006). If PV panel power is present (Yes at 1006) then normal operation continues (1004), otherwise a check for the presence of any measurements stored in the volatile high endurance memory that have not been written to NV memory is made (1008). If there are measurements that have not been written (Yes at 1008) then they are written from the volatile memory to the NV memory (1010). If there are no measurements to be written to NV memory (No at 1008) normal operation continues (1004).

The presence, or absence, of grid power may be determined by monitoring the grid frequency. The loss of grid power may be detected by the grid frequency departing beyond predetermined limits. For example, in an electrical grid with a nominal frequency of 50 hertz an upper limit on grid frequency might be 51.5 hertz and a lower limit might be 47.5 hertz. Monitoring the frequency of the grid can be done while consuming very little power using, for example, a phase locked loop. Additionally, in some situations the inverter may check for the presence of the grid in a procedure known as anti-islanding, which can be used in determining that there is no grid power.

The absence of PV panel power can be determined by monitoring the DC link capacitor, such as element 106 FIG. 2. If PV panel power is absent, then the DC link voltage across the capacitor will be no more than a peak value of the grid voltage. For example, if the grid voltage is 240 V RMS the peak voltage is 340 Volts. If PV panel power is present, however, the DC link voltage will be higher than the peak of the grid voltage. The loss of both panel and grid power might also be detected by only monitoring the DC link voltage. For example, if the grid voltage is 240 V RMS a DC link voltage of less than 340 V could indicate a loss of both grid and panel power. In some inverter designs, however, this operation may consume more power than monitoring the grid frequency and may therefore not be preferred.

In the method 1000, it is assumed that the loss of grid power is less frequent than the loss of PV panel power. Accordingly, the loss of the grid power is checked first in order to reduce an amount of processing that may be done unnecessarily. It is contemplated that the checks made at 1002, 1006 and 1008 can be performed in any order.

If the power for performing the write to the NV memory is provided by the DC link capacitor, the method 1000 needs to be repeatedly performed at a frequency sufficiently high that the complete loss of power can be detected quickly enough so that the write to the NV memory can be performed before the DC link capacitor is completely discharged. The required frequency will be based on the length of time to discharge the DC link capacitor, the length of time required to write the data to the NV memory, the amount of power stored in the DC link capacitor and the amount of power required to write to the NV memory.

Figure 11:
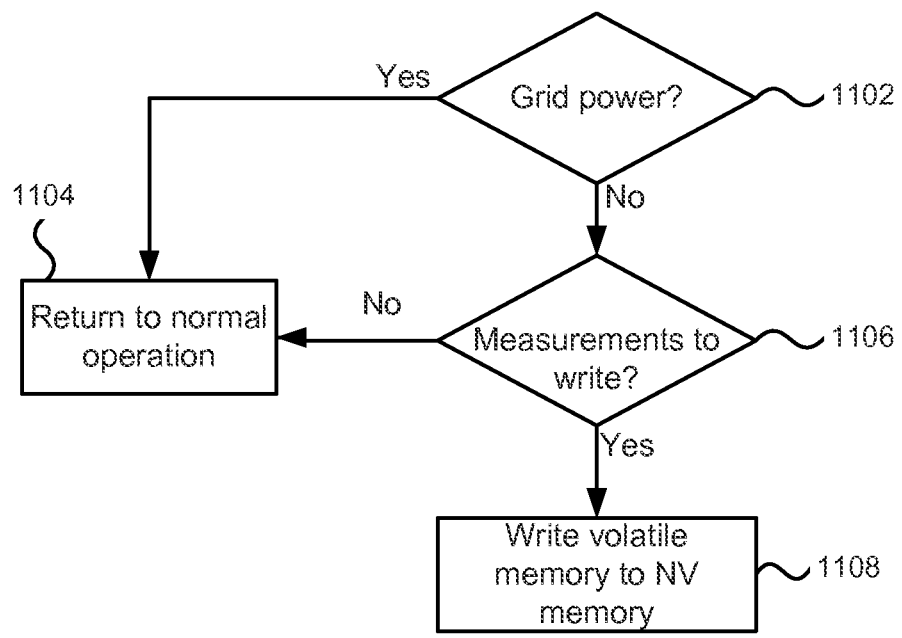
FIG. 11 is a flowchart of a further method to prevent the inverter's measurement data being lost from a loss of operating power.

FIG. 11 is a flowchart of a further method to prevent the inverter's measurement data being lost from a loss of operating power. Method 1100 is similar to method 1000 however in method 1100 there is no check for the loss of panel power. In method 1100 measurement data stored in the volatile memory are written to NV memory when there is a loss of grid power. Method 1100 may be suitable for areas where loss of grid power is infrequent and the endurance of the inverter's memory NV memory will therefore not be unduly affected by writing each time there is a grid failure.

The method 1100 continually checks to determine that grid power is present (1102). If grid power is present (Yes at 1102) normal operation continues (1104). If grid power is not present (No at 1102) a check for the presence of measurements stored in the volatile that have not been written to NV memory is made (1106). If there are measurements that haven't been written (Yes at 1106) then they are written from the volatile memory to the NV memory (1108). If there are no measurements to be written to NV memory (No at 1106) normal operation continues (1104).

Figure 12:
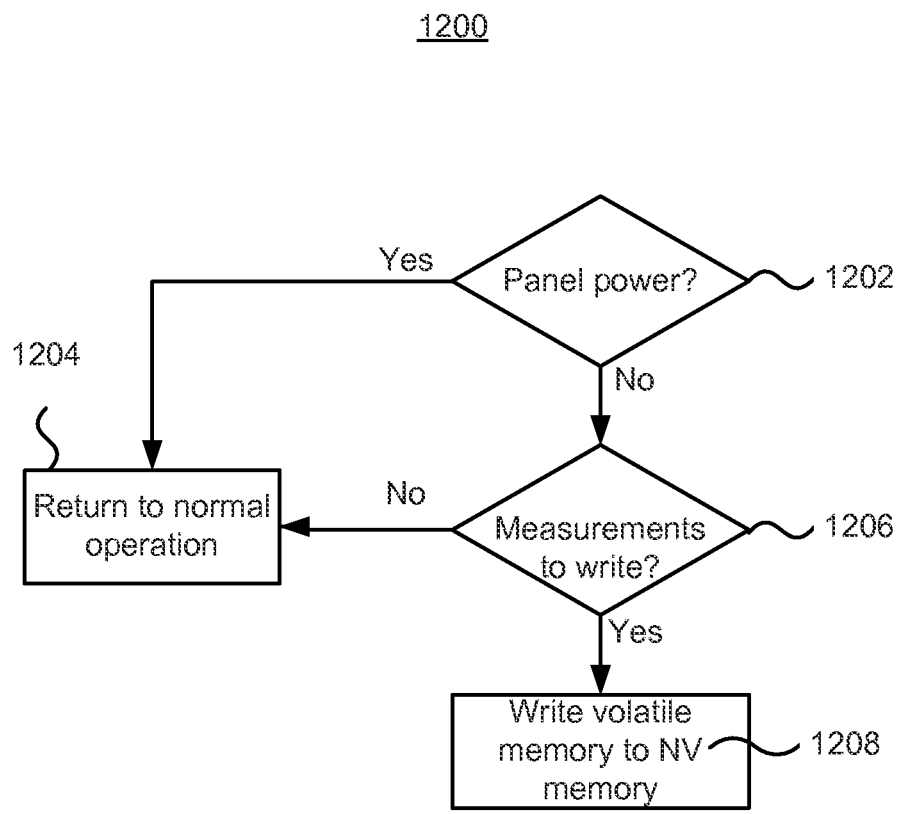
FIG. 12 is a flowchart of a further method to prevent the inverter's measurement data being lost from a loss of operating power.

FIG. 12 is a flowchart of a further method to prevent the inverter's measurement data being lost from a loss of operating power. Method 1200 is similar to method 1000; however, in the method 1200 there is no check for the loss of grid power. In method 1200 measurements stored in the volatile high endurance memory are written to the NV memory whenever there is a loss of panel power. Method 1200 may be suitable for inverters which power down and do not take measurements during periods of darkness when the PV panel is not producing as well as PV panels not connected to a grid, or connected to an unreliable grid.

The method 1200 continually checks to determine that panel power is present (1202). If panel power is present (Yes at 1202) normal operation continues (1204). If panel power is not present (No at 1202) a check for the presence of measurements stored in the volatile that have not been written to NV memory is made (1206). If there are measurements that haven't been written (Yes at 1206) then they are written from the volatile memory to the NV memory (1208). If there are no measurements to be written to NV memory (No at 1206) normal operation continues (1204).

As set forth above, measurements made at the inverter may be stored in NV memory. Such measurements may be useful in the operation of the inverter as well as provide potentially valuable information if repair or failure analysis of an inverter is required. As described above, the write endurance of the NV memory can be extended to provide reliable operation over the expected lifetime of the inverter through the use of high endurance memory to store the measurements until a write trigger condition is met. As described further below, it may be beneficial to store the measurement data at a remote server. The measurement data may be used for various purposes such as managing a PV panel array, displaying measurement data to users or consumers or for other purposes. Further, periodically copying data to a remote location may provide additional backup of information in the case that measurements are not stored in the NV memory, for example do to an error or catastrophic failure.

An inverter may communicate with a server and transmits some, or all, measurements to the server for storage. In the event of a power loss measurements can be restored from the server. In the following description measurements that are stored on the server but that have not yet been stored in NV memory are referred to as "server stored" measurements. It should be noted that the server may also maintain additional measurements that have been stored to NV memory. Measurements that are stored in the inverter's high endurance memory but that have not yet been stored on the server are referred to as inverter stored measurements.

Figure 13:
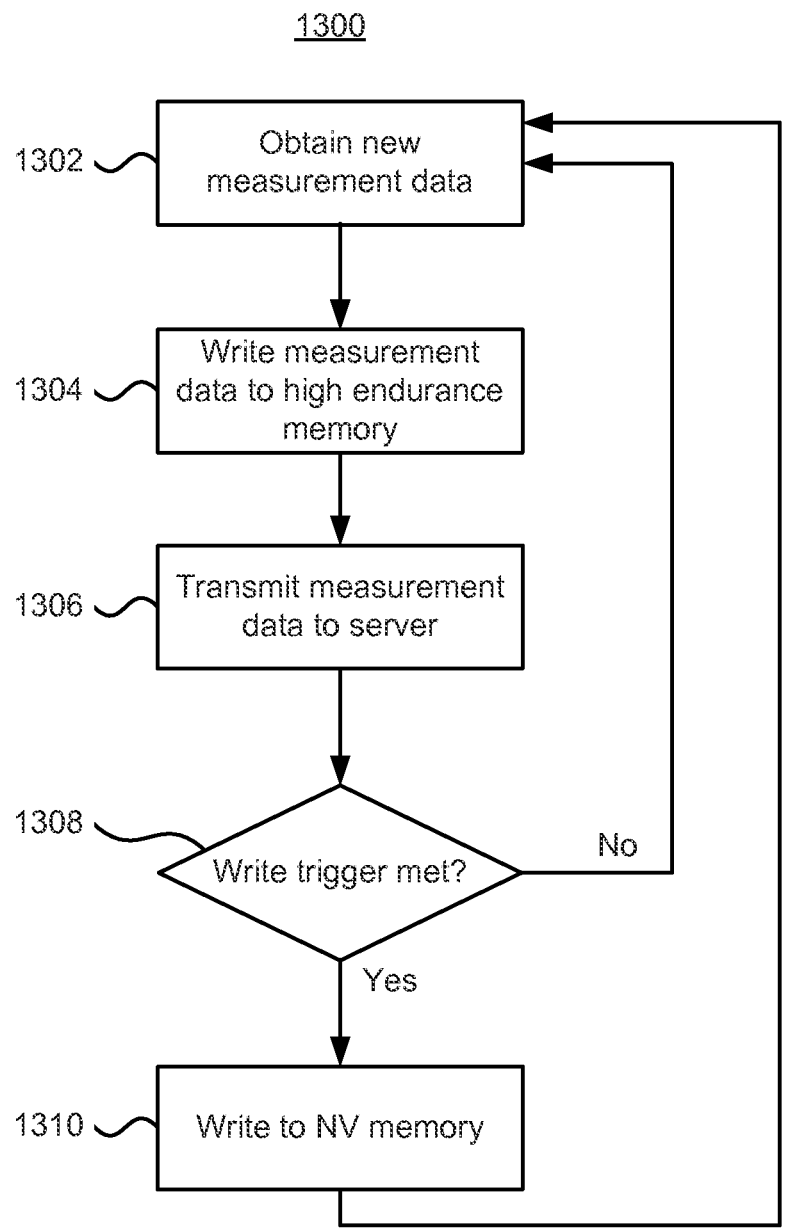
FIG. 13 is a flowchart showing a further method of extending the endurance of an inverter's NV memory.

FIG. 13 is a flowchart showing a further method of extending the endurance of an inverter's NV memory. The method 1300 transmits all measurements to a remote server. The method 1300 obtains measurement data of the inverter (1302) and writes the measurement data to high endurance memory (1304) as well as transmitting the measurements to a remote server for storage (1306). The method determines if a write trigger condition is met (1308) and if it is met (Yes at 1308) the measurement data is written from the high endurance memory to the NV memory (1310). New measurements may be obtained (1302) after the write to the NV memory or if the write trigger has not been met (No at 1308). Although described as writing the measurement data from the high endurance memory to the NV memory, it is contemplated that the measurement data could be written to the NV memory from the server stored measurements.

In some situations of limited communication bandwidth there might not be sufficient bandwidth between the remote server and the inverters, to accommodate writing to the server from the inverter every time a set of measurements are made.

Figure 14:
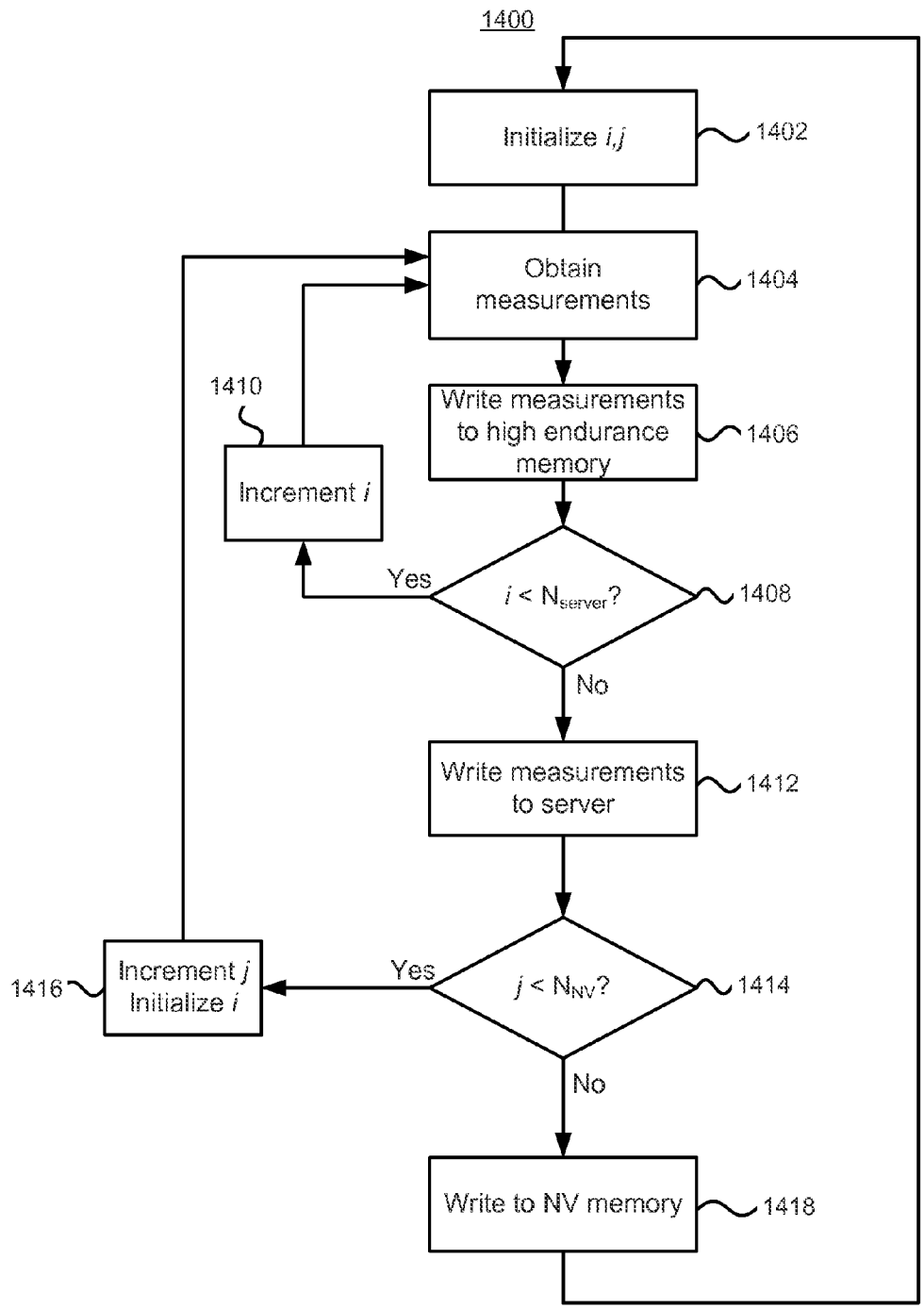
FIG. 14 is a flowchart showing a further method of extending the endurance of an inverter's NV memory.

FIG. 14 is a flowchart showing a further method of extending the endurance of an inverter's NV memory. The method 1400 employs a first threshold value, $N_{server}$ as a trigger condition for writing measurement data from the inverter to the server and a second threshold value, $N_{NV}$, for writing measurement data to the NV memory. In method 1400, counters i and j are initialized, for example to one (1402). A set of measurements are obtained (1404) and written to the high endurance memory (1406). The counter i is compared to the threshold for writing to the server, $N_{Server}$ (1408). If the counter i is less than $N_{Server}$ (Yes at 1408) then the counter i is incremented (1410) and another set of measurements are obtained (1404). If the counter i is not less than $N_{Server}$ (No at 1408) then the measurement data stored in the high endurance memory are written to the server (1412). Counter j is compared to the threshold for writing to the NV memory $N_{NV}$ (1414). If j is less than $N_{NV}$ (Yes at 1414) then the counter j is incremented and the counter i re-initialized, for example to one (1416). If j is not less than $N_{NV}$ (No at 1414) then all the server stored measurements are written to the inverter's NV memory (1418) and both counters i,j are re-initialized (1402). In this method the number of measurement sets written from the server to the NV memory is equal to $N_{Server} \times N_{NV}$. In this method, if the inverter's operating power is lost the maximum number of measurement sets that can be lost is $N_{Server}$. In this method the number of NVM writes is reduced by a factor of $1/N_{SERVER}$ compared to the method 600 without having to increase the size of the volatile high endurance memory. In one embodiment $N_{Server}$ and $N_{NV}$ are chosen such that measurements are written to the server once a day and written to the NV memory once per week, although other values are possible.

Figure 15:
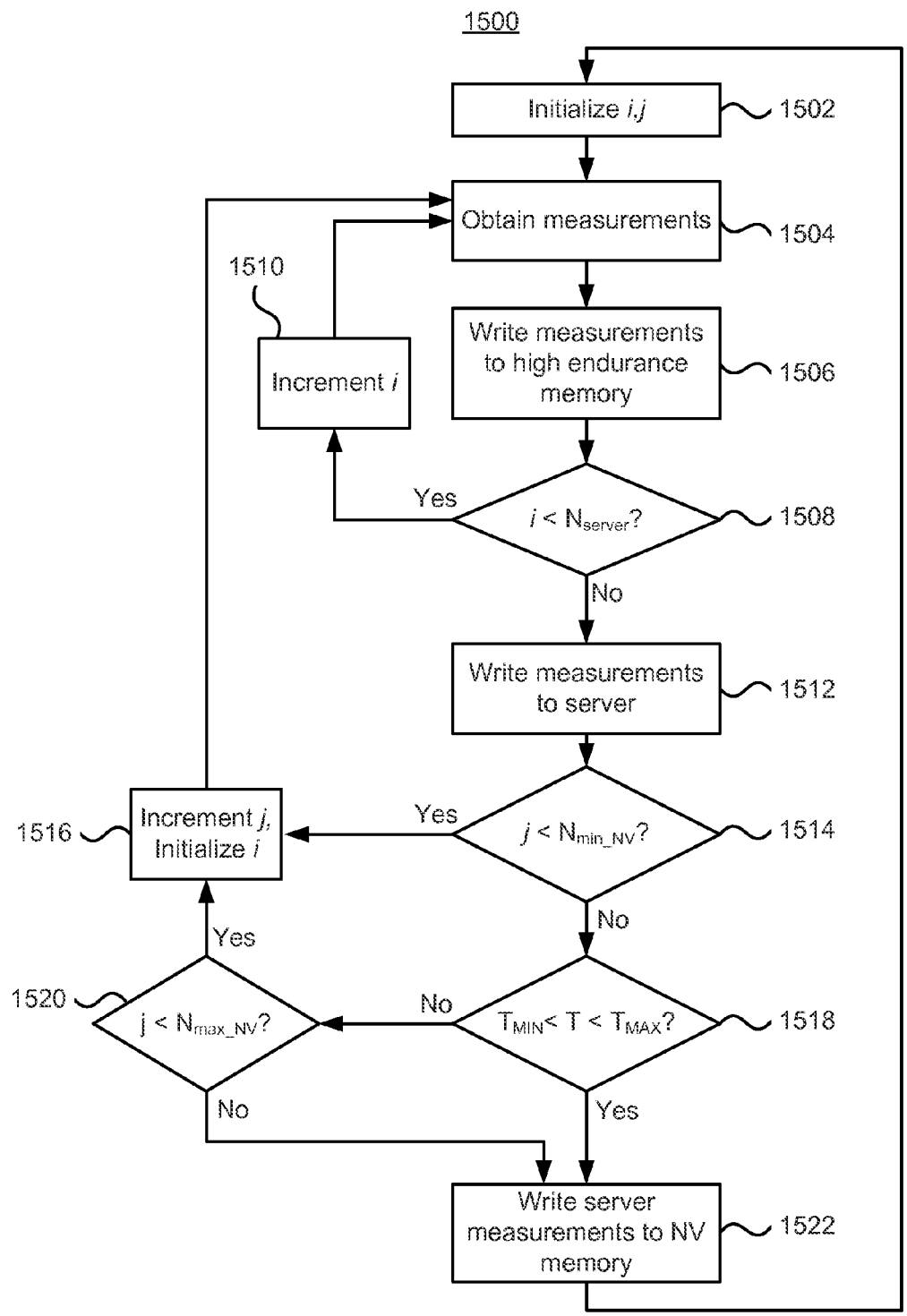
FIG. 15 is a flowchart showing a further method of extending the endurance of an inverter's NV memory.

FIG. 15 is a flowchart showing a further method of extending the endurance of an inverter's NV memory. The method 1500 is similar to the method 1400; however, in addition to writing to the server and NV memory based on a number of measurements made, the method 1500 also includes a temperature range for writing to the NV memory. In method 1500, counters i and j are initialized, for example to one (1502). A set of measurements are obtained (1504) and written to the high endurance memory (1506). The counter i is compared to the threshold for writing to the server, $N_{server}$ (1508). If the counter i is less than $N_{Server}$ (Yes at 1508) then the counter i is incremented (1510) and another set of measurements are obtained (1504). If the counter i is not less than $N_{Server}$ (No at 1508) then the measurement data stored in the high endurance memory are written to the server (1512). Counter j is compared to a minimum threshold for writing to the NV memory $N_{min\_NV}$ (1514). If j is less than $N_{min\_NV}$ (Yes at 1514) then the counter j is incremented and the counter i re-initialized, for example to one (1516). If j is not less than $N_{NV}$ (No at 1514) then the temperature of the inverter T is compared to upper and lower temperature limits $T_{MIN}$ and $T_{MAX}$ (1518). If the inverters temperature is between the upper and lower temperature limits (Yes at 1518) then the previous measurements stored in the high endurance memory, or the server stored measurements, are stored to the NV memory (1522) and the counters i,j are subsequently re-initialized (1502). If the temperature T is not within the upper and lower temperature limits (No at 1518) then the counter j is compared to a second write threshold "$N_{max\_NV}$" (1520). If j is less than $N_{max\_NV}$ (Yes at 1520) then j is incremented and i re-initialized (1516) and further measurements may be obtained. If j is not less than $N_{max\_NV}$ (No at 1520) then the previous measurement data stored to the high endurance memory, or the server stored measurement data, is stored to the NV memory (1522)

The above has described storing measurements to high endurance memory as well as non-volatile memory. The measurements written to each memory may include direct measurements as well as calculated measurements. For example, the direct measurements may include measurements, such as inverter temperature, made over a measurement cycle, such as 15 minutes. The calculated measurements may be calculated based on one or more direct measurements as well as measurements made over previous measurement cycles. For example, the calculated measurements may include a cumulative amount of power injected into the grid over the lifetime of the inverter, or a cumulative amount of time the inverter has been producing power.

Figure 16:
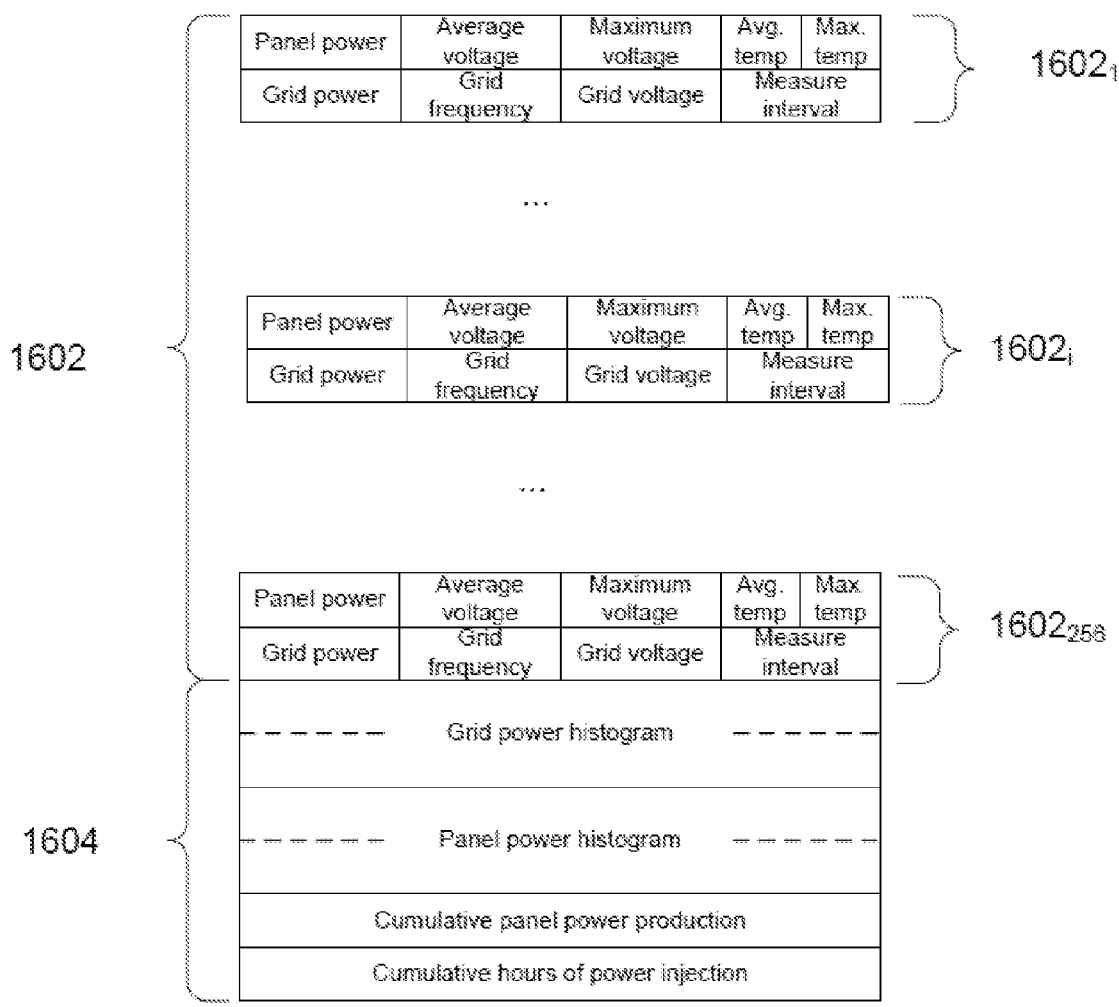
FIG. 16 depicts a block diagram of measurements that may be stored in the high endurance memory.

FIG. 16 depicts a block diagram of measurements that may be stored in the high endurance memory. The measurements 1600 may comprise measurements 1602 that are stored each measurement cycle. As depicted, 256 individual measurement sets $1602_1$ to $1602_{256}$ from the previous 256 measurement cycles are stored in the high endurance memory, although more or fewer measurement sets may be stored depending upon the size of each measurement set and the size of the high endurance memory. The measurements may further comprise measurements 1604 that are cumulative over a number of cycles and as such can be written over in memory with the updated measurement data.

The individual measurement sets $1602_1$ to $1602_{256}$ may each be for example 64 bytes, although a measurement set may be longer or shorter as required in order to store the desired measurements. The measurement sets, for example measurement set $1602_i$ stored for the $i^{th}$ previous measurement cycle, may include, for example, the average of the panel power, an average voltage of the DC link between the DC-to-DC converter and the DC-to-AC converter, a maximum voltage of the DC link, an average temperature of the inverter, a maximum temperature of the inverter, an amount of power injected into the AC grid, an average of the AC grid frequency, an average of the grid voltage, as well as a length of the measurement interval for the measurement cycle.

The measurements 1604 that may be updated for each measurement cycle may include grid power histogram information, panel power histogram information, cumulative panel power production information and cumulative grid power injection information. The measurements 1604 may be, for example 256 Bytes. It will be appreciated that other measurement information may be included, and/or depicted measurement information omitted.

Figure 17:
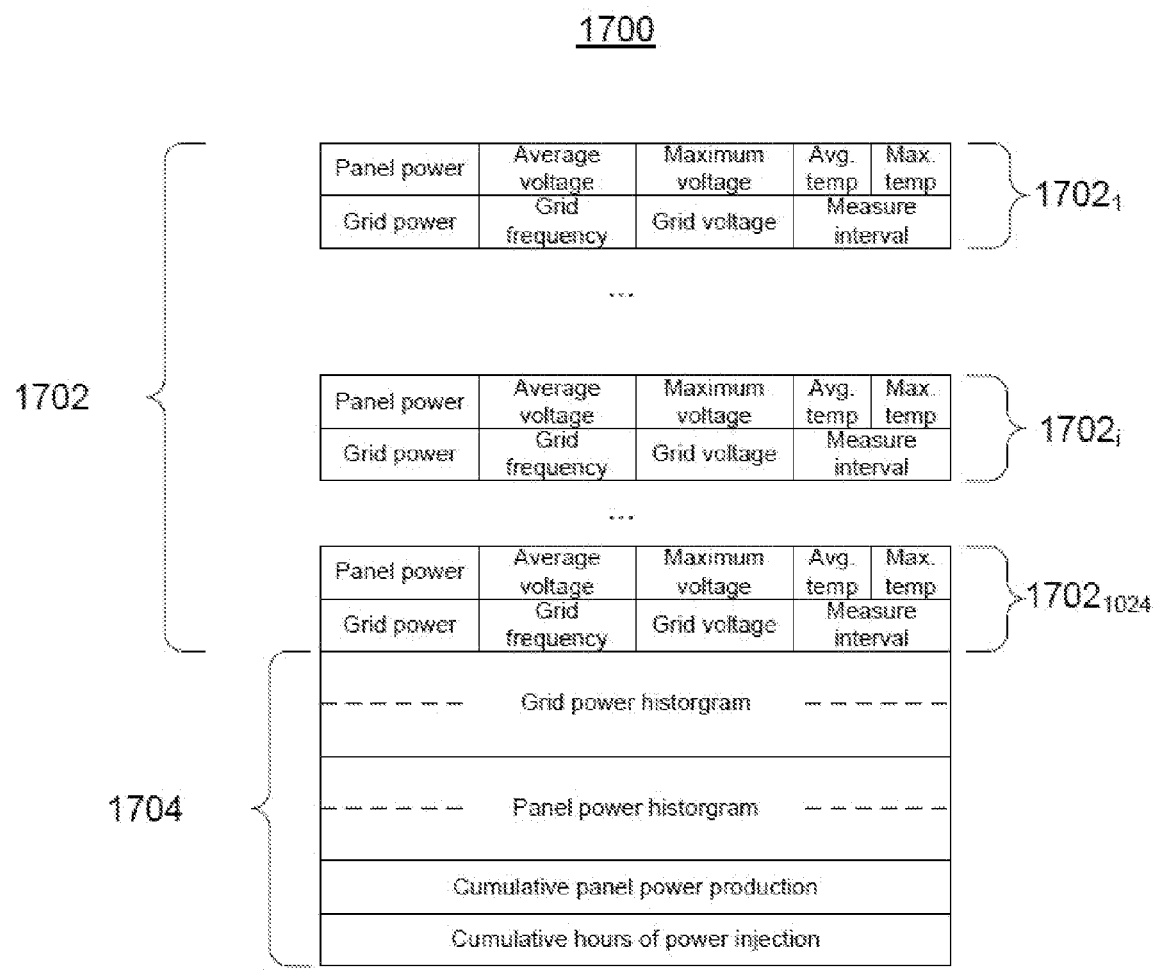
FIG. 17 depicts a block diagram of measurements that may be stored in the NV memory.

FIG. 17 depicts a block diagram of measurements that may be stored in the NV memory. The measurements 1700 stored to the NV memory may include measurements 1702 for each measurement cycle. These measurements may comprise individual measurement sets $1702_1$ to $1702_{1024}$ that are stored for the last 1024 measurement cycles. These measurements may include the average of the panel power, an average voltage of the DC, a maximum voltage of the DC link, an average temperature of the inverter, a maximum temperature of the inverter, an amount of power injected into the AC grid, an average of the AC grid frequency, an average of the grid voltage, as well as a length of the measurement interval for the measurement cycle. As depicted in FIG. 17, 1024 of the previous measurement sets $1702_1$ to $1702_{1024}$ may be stored in the NV memory.

As depicted, the measurements 1700 may further include measurement data 1704 that is overwritten with updated measurements. These measurements 1704 may include grid power histogram information, panel power histogram information, cumulative panel power production information and cumulative grid power injection information.

Although the above has described a panel inverter for use with a PV panel, it is contemplated that the inverter, or components of the inverter, may be used with other DC power sources. The inverter described above can provide an inverter capable of storing measurement data while still providing adequate expected lifetime by extending the lifetime of the memory used to provide non-volatile storage of the measurement data.

What is claimed is:

1. An inverter for a photovoltaic (PV) panel comprising:
   power components for producing an alternating current (AC) output from a direct current (DC) input from the PV panel;
   a sensor for measuring an operating characteristic of the inverter;
   a non-volatile memory for storing measurement data;
   a high endurance memory for storing the data of the non-volatile memory while sufficient power is available;
   a controller for extending an expected lifetime of an inverter by:
   obtaining one or more measurements of the inverter;
   storing the one or more measurements to a high endurance memory of the inverter;
   determining if a NV-write trigger condition is met; and
   storing at least a portion of the one or more measurements stored to the high endurance memory to non-volatile memory of the inverter when the NV-write trigger condition is met.

2. The inverter of claim 1, wherein the high endurance memory comprises a volatile memory.

3. The inverter of claim 1, wherein obtaining the one or more measurements of the inverter comprises measuring at least one operating characteristic of the inverter using at least one sensor of the inverter.

4. The inverter of claim 3, wherein obtaining the one or more measurements further comprises:
   retrieving a previous measurement from the high endurance memory; and
   updating the previous measurement retrieved from the high endurance memory based on the at least one operating characteristic measured using the at least one sensor.

5. The inverter of claim 1, wherein the one or more measurements are obtained at regular intervals.

6. The inverter of claim 1, wherein the NV-write trigger condition comprises at least one characteristic measurable at the inverter and at least one associated triggering value, each of the at least one associated triggering values identifying the value of the respective characteristic measurable at the inverter at which the NV-write trigger condition is met.

7. The inverter of claim 6, wherein the inverter comprises a microinverter for a solar photovoltaic panel, wherein the at least one characteristic of the NV-write trigger condition comprises one or more of:
   an operating temperature of the microinverter; and
   a number of measurements obtained without storing to the NV memory.

8. The inverter of claim 7, further comprising:
   updating a counter indicative of the number of measurements obtained, wherein determining if a NV-write trigger condition is met comprises:
   determining that the NV-write trigger condition is met when the counter meets a threshold value; and
   determining that NV-write trigger condition is not met when the counter does not exceed the threshold value,
   resetting the counter indicative of the number of measurement data obtained when the NV-write trigger condition is determined to be met.

9. The inverter of claim 8, wherein determining if a NV-write trigger condition is met further comprises:
   determining that the NV-write trigger condition is met when a temperature of the inverter is below a maximum temperature threshold value; and
   determining that NV-write trigger condition is not met when the temperature of the inverter is not below the maximum temperature threshold value.

10. The inverter of claim 7, wherein determining if a NV-write trigger condition is met comprises:
    determining that the NV-write trigger condition is met when a temperature of the inverter is below a maximum temperature threshold value; and
    determining that NV-write trigger condition is not met when the temperature of the inverter is not below the maximum temperature threshold value.

11. The inverter of claim 7, wherein determining if a NV-write-trigger condition is met comprises:
    determining that the NV-write trigger condition is met when a temperature of the inverter is below a maximum temperature threshold value and above a minimum temperature threshold value; and
    determining that NV-write trigger condition is not met when the temperature of the inverter is not below the maximum temperature threshold value or the temperature of the inverter is not above the minimum temperature threshold value.

12. The inverter of claim 1, further comprising:
    detecting a loss of inverter operating power; and
    copying at least a portion of the high endurance memory to the NV memory when the power loss is detected.

13. The inverter of claim 12, wherein detecting the loss of operating power of the inverter comprises one or more of:
    detecting a loss of power supplied by a PV panel coupled to the inverter; and
    detecting a loss of power supplied by an AC electrical grid coupled to the inverter.

14. The inverter of claim 13, wherein detecting the loss of operating power supplied by a PV panel coupled to the inverter comprises:
    determining if a voltage across a DC-link capacitor of the inverter falls below a threshold value.

15. The inverter of claim 13, wherein detecting the loss of power supplied by the AC electrical grid comprises:
    detecting that the frequency of the AC electrical grid falls outside of a frequency threshold range.

16. The inverter of claim 13, further comprising:

determining if there are measurements stored in the high endurance memory that have not been stored to the NV memory.

17. The inverter of claim 1, wherein the one or more measurements of the inverter comprise one or more of:

an average operating temperature of an inverter component over a previous measurement cycle associated with the average operating temperature measurement;

a maximum operating temperature of the inverter component over a previous measurement cycle associated with the maximum operating temperature measurement;

a summation of power supplied to the inverter over a previous measurement cycle associated with the summation of power supplied measurement;

a maximum amount of power supplied to the inverter over a previous measurement cycle associated with the maximum amount of power supplied measurement;

a summation of power output from the inverter over a previous measurement cycle associated with the summation of power output measurement; and a maximum amount of power output from the inverter over a previous measurement cycle associated with the maximum amount of power output measurement.

18. The inverter of claim 1, wherein the controller for extending an expected lifetime of the inverter further:

determines if a second trigger condition is met; and stores at least a portion of the one or more measurements stored to the high endurance memory to a server when the second trigger condition is met.

* * * * *